United States Patent [19]

Park

[11] Patent Number: 4,605,895

[45] Date of Patent: Aug. 12, 1986

[54] DOMESTIC ELECTRICAL TESTER

[76] Inventor: Alan J. C. Park, Waterside Cottage, Bowden La., Chapel en le Frith, Stockport SK12.6QF, England

[21] Appl. No.: 587,968

[22] Filed: Mar. 9, 1984

[51] Int. Cl.[4] .............................................. G01R 19/14
[52] U.S. Cl. ................... 324/133; 324/73 R; 340/635
[58] Field of Search ............ 324/133, 51, 73 R; 340/635, 657

[56] References Cited

U.S. PATENT DOCUMENTS

| | | | |
|---|---|---|---|
| 706,798 | 8/1902 | Chapman | 324/51 |
| 3,157,870 | 11/1964 | Marino et al. | 324/133 X |
| 3,831,089 | 8/1974 | Pearce | 324/133 X |
| 3,925,771 | 12/1975 | Satake | 324/133 X |
| 4,025,850 | 5/1977 | Spiteri | |
| 4,118,664 | 10/1978 | Fields | 324/133 X |

FOREIGN PATENT DOCUMENTS

| | | |
|---|---|---|
| 569179 | 5/1945 | United Kingdom . |
| 1229615 | 4/1971 | United Kingdom . |
| 1562578 | 3/1980 | United Kingdom . |
| 1573080 | 8/1980 | United Kingdom . |
| 1595478 | 8/1981 | United Kingdom . |

*Primary Examiner*—Stanley T. Krawczewicz
*Attorney, Agent, or Firm*—Stevens, Davis, Miller & Mosher

[57] ABSTRACT

Disclosed is an electrical testing device which comprises a plurality of measuring terminal pairs and circuit means connected to the measuring terminal pairs for measuring a respective electrical parameter by means of each of the terminal pairs, the electrical circuit means operating differently depending on which of the measuring terminal pairs is used for a measurement; and indicator means connected to the circuit means for indicating the result of a measurement using one of the measuring terminal pairs.

11 Claims, 2 Drawing Figures

DOMESTIC ELECTRICAL TESTER

BACKGROUND OF THE INVENTION

1. Field of the Invention

The present invention relates to an electrical tester which can be used by a householder to conduct a variety of simple diagnostic tests on electrical apparatus within and around a home and automobile.

2. Discussion of the Prior Art

A standard electrical "multi-meter" is known and is used by an electrician or electronics enthusiast to perform various electrical, e.g., resistance, voltage and current, measurements. However, the complexity of construction and the effective interpretation of readings associated with a multi-meter render the device outside the understanding and need of most people. Their need is not to define an absolute value of electrical voltage, current or resistance but, more simply, to identify a sound or unsound condition in an electrical component or unit to give direction to their future action.

While there are a number of simple items of domestic test equipment in existence for testing single functions, e.g., neon screwdrivers for testing the presence of live terminals carrying 110–240 v AC power, they are limited to testing a single function and thus have limited use.

SUMMARY OF THE INVENTION

One object of the invention is the provision of a relatively simple, easy to use electrical tester which enables a homeowner to perform a multitude of electrical tests.

Another object of the invention is the provision of a small, lightweight, battery powered electrical tester which is easily transported and simply yet accurately operated.

The invention provides an electrical tester circuit and arrangement which has a plurality of terminal pairs, each for accomplishing a different testing function, commonly connected to a circuit means which energizes an indicator, such as a lamp. Testing is performed using the terminal pairs for respective measurements. The terminal pairs can be used either individually or in combination. Thus, with the invention, a homeowner can perform diagnostic checks on a wide variety of everyday electrical components and apparatus, in and around his home and automobile using an inherently simple to use testing device.

The above and other objects, advantages and features of the invention can be more fully appreciated from the following detailed description of the invention, which is provided in connection with the accompanying drawings.

DETAILED DESCRIPTION OF THE INVENTION

Figure 1:
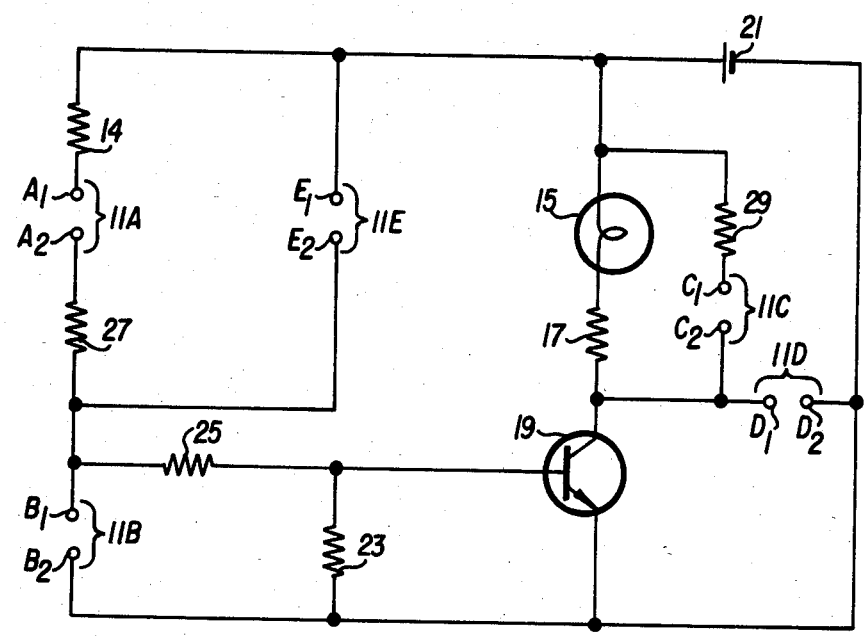
FIG. 1 illustrates in schematic form one embodiment of the electrical tester of the invention; and, FIG. 2 illustrates an exemplary front panel arrangement which can be employed in the invention.
Figure 2:
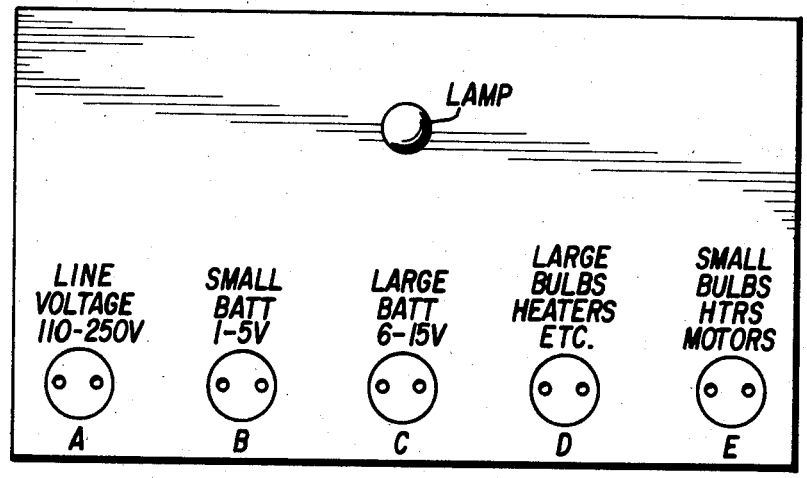

FIG. 1 shows a schematic circuit diagram of one embodiment of the invention, while FIG. 2 illustrates a representative housing front panel which can be used in the invention. The circuit includes a plurality of terminal pairs 11A ... 11E, and FIG. 2 contains legends adjacent each terminal pair which identifies the electrical parameter to be measured using that pair of terminals. As shown, terminals 11A are used to measure an AC power voltage, e.g., 110–240 v, terminals 11B are used to measure a first low DC voltage, e.g., 1.5–5 v, terminals 11C are used to measure a second low DC voltage, terminals 11D are used to measure a low resistance, e.g., in the range of 0–200 ohms, and terminals 11E are used to measure a high resistance, e.g., in the range of 0–8K ohms. The parameter (voltage and resistance) ranges identified above encompass parameter values typically encountered in a household and automotive environment.

The first pair of terminals 11A have a first terminal $A_1$ thereof connected through a resistor 14 to: a first terminal $E_1$ of the terminal pair 11E; a positive terminal of battery 21; and, one side of a lamp 15, the other side of which is connected to the collector of an NPN transistor 19 trough a resistor 17. The transistor collector is also connected to a second terminal $C_2$ of the terminal pair 11C and to a first terminal $D_1$ of the terminal pair 11D.

The negative terminal of battery 21 is connected to: the second terminal $D_2$ of the terminal pair 11D; the second terminal $B_2$ of the terminal pair 11B; one side of a resistor 23; and, the emitter of transistor 19. The other side of resistor 23 is connected to the base of transistor 19 and one side of a resistor 25, the other side of which is connected to: the second terminal $E_2$ of the terminal pair 11E; the first terminal $B_1$ of the terminal pair 11B; and, to one side of a resistor 27, the other side of which is connected to the second terminal $A_2$ of the terminal pair 11A. The first terminal $C_1$ of the terminal pair 11C is connected through a resistor 29 to the positive terminal of battery 21 and to the one side of lamp 15.

The arrangement of terminal pairs 11A ... 11E, and lamp 15 on an exterior face of a housing (not shown) of the tester of the invention is shown in FIG. 2. Terminals 11A ... 11E exit the housing as sockets for receiving test leads.

The manner in which the FIG. 1 circuit is used to perform five different electrical tests will now be described.

Terminals 11A are used to determine whether or not an AC power voltage is present at a particular location. Electrical leads are connected to terminals 11A and are used to check for the presence of the AC voltage. When a voltage is present, lamp 15 lights due to the application of the AC voltage on terminals 11A. An AC voltage present on terminals 11A is applied through resistor 14 and the voltage divider formed by resistor 23, 25 and 27 to the base of transistor 19, causing the transistor to conduct and light lamp 15.

Terminals 11B are used with test leads to determine the presence of a low voltage DC, e.g., up to 5 volts. Terminals 11B could be used to determine whether or not a voltage exists, for example, at a small battery. Any voltage above approximately 1 volt will cause lamp 15 to light. The voltage applied to terminals 11B, if over 1 volt, and with the positive polarity connected to terminal $B_1$, will provide enough bias to cause transistor 19 to conduct and light lamp 15.

Terminals 11C are used with test leads to determine the presence of a low DC voltage in the range of approximately 6 to 15 volts, with the brightness of lamp 15 being in proportion to the magnitude of the applied voltage. This voltage range is particularly useful in checking for the presence of a voltage in automobile electrical systems. When terminals 11C are used, the transistor 19 is not used in the testing circuit and, instead, the voltage is applied, through resistor 29, across lamp 15 and resistor 17. Resistor 29 serves to reduce the current passing through lamp 15.

Terminals 11D are used to provide a simple continuity check. Lamp 15 will illuminate fully when the test leads are connected together through a short circuit. The brightness of lamp 15 will progressively weaken with an increasing resistance between the test leads connected to terminals 11D. Lamp 15 will become completely extinguished when this resistance reaches or exceeds approximately 200 ohms. Thus, terminals 11D are particularly suitable for testing fuses, leads and low resistance circuit elements, such as heaters, lamps, motors, etc. When terminals 11D are used, transistor 19 is again not used. Instead, an electrical circuit is defined by battery 21, lamp 15 and resistor 17 which is bridged by terminals 11D, enabling the circuit to respond as described above.

Terminals 11E test a similar function to that of terminals 11D, but are used to indicate continuity through an electrical circuit of up to approximately 8K ohms. Thus, terminals 11E could be used for testing higher resistive circuit elements, e.g., low wattage devices, lamps, electric blankets, etc. When using terminals 11E, the transistor 19 is biased to switch on lamp 15, in accordance with the resistance applied thereacross. Biasing voltage for transistor 19 is provided by battery 21 through this resistance, as well as through resistors 23 and 25.

The tester circuit depicted in FIG. 1 is conveniently enclosed in a plastic box housing, which protects a user from live circuit elements when terminals 11A are used to test for an AC power voltage. Since separate terminal pairs 11A . . . 11E are provided for each test function, the complex and extensive rotary switch typically used in conventional multi-testers can be eliminated, while providing an easy to use tester having greater reliability and a simplified construction.

While a preferred embodiment of the invention has been described and illustrated, it should be apparent that many modifications can be made to the invention within its spirit and scope. For example, while five terminal pairs 11A . . . 11E and associated test functions have been described and illustrated, a lesser or greater number of terminal pairs and functions can be employed. Thus, the invention can be arranged to use only terminals 11A, 11B and 11E to measure their associated functions. Also, although the disclosed circuit uses an NPN transistor, a PNP transistor can also be used, with suitable circuit modifications understood by those skilled in the art.

Accordingly, the invention is not to be construed as being limited by the foregoing description, but is only limited by the scope of the claims appended hereto.

I claim:

1. An electrical testing device, comprising:
    at least a first, second and third measuring terminal pairs;
    circuit means connected to said measuring terminal pairs for measuring a respective electrical parameter by means of each of said terminal pairs, said circuit means operating differently depending on which of said measuring terminal pairs are used for a measurement;
    indicating means connected to said circuit means for indicating the result of a measurement using one of said measuring terminal pairs;
    said circuit means being responsive to:
        (a) said first pair of measuring terminals to energize said indicating means when an applied voltage thereat is in a first predetermined voltage range;
        (b) said second pair of measuring terminals to energize said indicating means when an applied DC voltage thereat is in a second predetermined voltage range; and,
        (c) said third pair of measuring terminals to energize said indicating means when a resistance applied across said third pair of measuring terminals is below a first predetermined value.

2. An electrical testing device as in claim 1, further comprising fourth and fifth measuring terminal pairs and wherein said circuit means is further responsive to:
    (d) said fourth pair of measuring terminals to energize said indicator means in response to a voltage thereat in a third voltage range; and,
    (e) said fifth pair of measuring terminals to energize said indicator means when a resistance applied across said fifth pair of measuring terminals is below a second predetermined value.

3. An electrical testing device as in claim 1 wherein said first predetermined voltage range is approximately 110–240 volts.

4. An electrical testing device as in claim 1, wherein said second predetermined voltage range is approximately 1.5 to 6 volts.

5. An electrical testing device as in claim 1, wherein said first predetermined value is approximately 8K ohms.

6. An electrical testing device as in claim 2, wherein said third voltage range is approximately 6 to 15 volts.

7. An electrical testing device as in claim 2, wherein said second predetermined value is approximately 200 ohms.

8. An electrical testing device as in claim 1, wherein said pairs of measuring terminals, said circuit means and said indicating means are contained in a common housing, with said terminal pairs being connected to electrical connectors for connection with test leads, said indicator means comprising a lamp viewable from outside said housing.

9. An electrical testing device as in claim 1, wherein said circuit means comprises:
    first and second resistors respectively connected at first ends thereof to said first pair of measuring terminals, said third pair or measuring terminals being connected respectively to second ends of said first and second resistors, said second end of said first resistor being connected to a first side of a voltage source;
    a resistance divider formed by third and fourth resistors connected to one another at first ends thereof, said third resistor being connected at a second end thereof to the second end of said second resistor, said fourth resistor being connected at a second end thereof to a second side of said voltage source, said second pair of measuring terminals being respectively connected to the second ends of said third and fourth resistors;
    a transistor having a base connected to the connected first ends of said third and fourth resistors and an emitter connected to said second side of said voltage source; and
    a fifth resistor connected at a first end to a collector of said transistor, said indicating means being respectively connected to said first side of said voltage source and a second end of said fifth resistor.

10. An electrical testing device as in claim 2, wherein said circuit means comprises:

first and second resistors respectively connected at first ends thereof to said first pair of measuring terminals, said third pair of measuring terminals being connected respectively to second ends of said first and second resistors, a second end of said first resistor being connected to a first side of a voltage source;

a resistance divider formed by third and fourth resistors connected to one another at first ends thereof, said third resistor being connected at a second end thereof to the second end of said second resistor, said fourth resistor being connected at a second end thereof to a second side of said voltage source, said second pair of measuring terminals being respectively connected to the second ends of said third and fourth resistors;

a transistor having a base connected to the connected first ends of said third and fourth resistors and an emitter connected to said second side of said voltage source;

a fifth resistor connected at a first end to a collector of said transistor, said fifth pair of measuring terminals being respectively connected to said collector and said second side of said voltage source; and a sixth resistor having a first end connected to said first side of said voltage source, said fourth pair of measuring terminals being respectively connected to a second end of said sixth resistor and said collector, said indicating means being respectively connected to said first side of said voltage source and a second end of said fifth resistor.

11. An electrical testing device, comprising:

a plurality of measuring terminal pairs;

circuit means connected to said measuring terminal pairs for measuring a respective electrical parameter by means of each of said terminal pairs, said circuit means operating differently depending on which of said measuring terminal pairs are used for a measurement, said circuit means including only one transistor which is responsive to an electrical parameter measured with at least one of said plurality of measuring terminal pairs; and indicating means connected to said circuit means for indicating the result of a measurement using one of said measuring terminal pairs, said indicating means including only one lamp which is connected to said circuit means.

* * * * *